United States Patent [19]

Legge

[11] Patent Number: 4,592,129
[45] Date of Patent: Jun. 3, 1986

[54] METHOD OF MAKING AN INTEGRAL, MULTIPLE LAYER ANTIREFLECTION COATING BY HYDROGEN ION IMPLANTATION

[75] Inventor: Ronald N. Legge, Scottsdale, Ariz.

[73] Assignee: Motorola, Inc., Schaumburg, Ill.

[21] Appl. No.: 718,316

[22] Filed: Apr. 1, 1985

[51] Int. Cl.[4] .................. H01L 31/06; B05D 3/06
[52] U.S. Cl. .................... 29/572; 29/576 B; 148/1.5; 148/187; 148/DIG. 153; 136/256; 427/38; 427/74; 427/75
[58] Field of Search ............ 148/1.5, 187; 29/576 B, 29/572; 427/38, 74, 75; 136/256

[56] References Cited

U.S. PATENT DOCUMENTS

| | | | |
|---|---|---|---|
| 3,517,198 | 6/1970 | Phillips | 250/211 |
| 3,915,755 | 10/1975 | Goetzberger | 148/1.5 |
| 4,001,049 | 1/1977 | Baglin et al. | 148/1.5 |
| 4,086,102 | 4/1978 | King | 29/572 |
| 4,145,457 | 3/1979 | Kersten | 427/38 |
| 4,465,337 | 8/1984 | Baron et al. | 427/38 |
| 4,466,839 | 8/1984 | Dathe et al. | 148/1.5 |
| 4,521,443 | 6/1985 | Naik et al. | 427/38 |
| 4,528,418 | 9/1985 | McGill | 29/572 |

OTHER PUBLICATIONS

Cox et al. in Physics of Thin Films, Adv. in R/D, Academic Press, (ed) Hass et al., N.Y., pp. 239–304.
Webb et al., J. Physics, D. Appl. Phys., 9 (1976), 1343.
Schalch et al., Thin Solid Films, 124 (Feb. 1985), 301.
Lasky, J. Appl. Phys., 53 (1982), 9038.

Primary Examiner—Upendra Roy
Attorney, Agent, or Firm—John A. Fisher

[57] ABSTRACT

A process is disclosed for fabricating an improved antireflection coating on a substrate. A layer of dielectric material having a first thickness and a first index of refraction are formed overlying a substrate. The dielectric material is implanted with hydrogen to form an implanted surface region having a thickness less than the thickness of the entire layer of dielectric material. The hydrogen reduces the index of refraction of the implanted region to a value less than the index of refraction of the initial layer. The structure overlying the substrate thus includes two integral layers having different indices of refraction with the lower index of refraction, as desired, at the surface of the dielectric material. The process can be extended by further implantation to provide an increased number of distinct layers of differing index or to provide a continuum of regions of varying index of refraction.

10 Claims, 3 Drawing Figures

METHOD OF MAKING AN INTEGRAL, MULTIPLE LAYER ANTIREFLECTION COATING BY HYDROGEN ION IMPLANTATION

BACKGROUND OF THE INVENTION

This invention relates generally to a process for forming antireflection coatings, and more specifically to a process for forming integral, multiple layer antireflection coatings and devices using these coatings.

The amount of reflection from a surface is a function of the index of refraction of the material on either side of that surface. For example, for an optical lens in air, the amount of light reflected from the surface of the lens is a function of the index of refraction of the material making up the lens and the index of refraction of air. It is well known in optics that the reflection from a surface can be reduced by providing that surface with an antireflection layer. An antireflection coating for the lens in air is a material having an index of refraction intermediate that of the lens material and air.

The effectiveness of a antireflection coating is a function of the indices of refraction involved, the thickness of the antireflection layer, and the wavelengths of light involved. A conventional antireflection coating, for example, consists of a dielectric layer that has an optical thickness equal to one quarter of the wavelength of the incident light (as measured in the dielectric) at which the minimum reflectance is desired. Reflectance as a function of wavelength increases sharply on either side of this minimum. For applications in which reduced reflectance is desired over a wide range of wavelengths (such as minimizing reflection losses over the usable solar spectrum for solar cells), a multiple layer antireflection coating can be used providing that each successive layer of the coating has an index of refraction less than the layer immediately below and greater than the layers above. The use of such multiple layer antireflection coatings is described, for example, in the text *Physics of Thin Films, Advances in Research and Development*, Academic Press, 1964, edited by Hass and Thun, pages 239–304.

Multiple layer antireflection coatings have been achieved, for example, by multiple depositions of dissimilar materials, each with its own index of refraction. Such multiple depositions are time-consuming, expensive, and often difficult to achieve. Careful consideration must be given to chemical compatibility, thermal expansion coefficients, and stresses resulting from the deposition processes used and inherently from the different materials used.

On view of applications requiring multiple layer antireflection coatings and of the difficulty in providing such coatings by prior art methods, a need existed for an improved process for forming multiple layer antireflection coatings which would overcome difficulties attendant with the prior art processes.

It is therefore an object of this invention to provide an improved process for providing an integral, multiple layer antireflection coating.

It is a further object of this invention to provide an improved process for reducing the reflectance of a semiconductor substrate.

It is a still further object of this invention to provide a process for fabricating an improved photosensitive semiconductor device.

It is yet another object of this invention to provide a process for an improved photovoltaic cell.

BRIEF SUMMARY OF THE INVENTION

The foregoing and other objects and advantages of the invention are achieved through a process in which the optical properties of a layer of dielectric material are altered by controllably implanting hydrogen ions into the material. An improved antireflection coating on a substrate is achieved, for example, by forming a layer of dielectric material such as silicon nitride on a surface of the substrate. As formed, the dielectric material has a given thickness and index of refraction. The index of refraction of a surface region of the dielectric material is lowered by implanting hydrogen ions into a region which extends from the surface of the dielectric material to a depth which is less than the thickness of the entire layer of dielectric material. The resultant structure includes a first thickness of material having the original index of refraction with a second overlying layer of ion implanted material having a lower index of refraction.

DETAILED DESCRIPTION OF PREFERRED EMBODIMENTS

Figure 1:
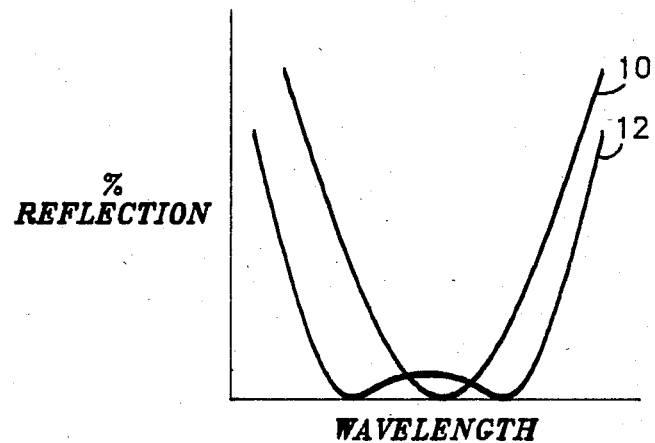
FIG. 1 schematically illustrates reflectance from a surface as a function of the wavelength of the incident light.

FIG. 1 illustrates the amount of reflection from a surface as a function of the wave length of light incident on that surface. Response curve 10 illustrates the amount of reflection from a surface when a single layer antireflection coating is formed on the surface. Zero or near zero reflection is achieved at a single wave length for which the optical thickness of the antireflection coating is an odd multiple of one quarter wave length. For wave lengths of incident light on either side of the minimum, the reflection increases rapidly. Response curve 12 indicates the amount of reflection from a surface when a double layer antireflection coating is applied to that surface. Low, zero, or near zero reflection is achieved over a relatively wide range of wave lengths. To achieve this effect, the indices of refraction for the surface material, each of the layers of the antireflection coating, and the medium into which the reflection takes place must have the relationship that each index of refraction must be lower than the immediately preceeding index. For example, for a two layer antireflection coating on a silicon substrate (index of refraction for silicon in the range 3.5–6.0) with a glass plate covering the structure (index of refraction for glass about 1.5), the two layers of the antireflection coating must have indices of refraction such that the layer next to the silicon has an index less than that of silicon and greater than the index of refraction of the other antireflection layer. The other antireflection layer, in turn, must have a higher index of refraction than the glass. That is, indices of refraction, $n_i$, must have the relationship $n_{air} < n_{glass} < n_{dielectric\ 1} < n_{dielectric\ 2} < n_{Si}$.

Figure 2:
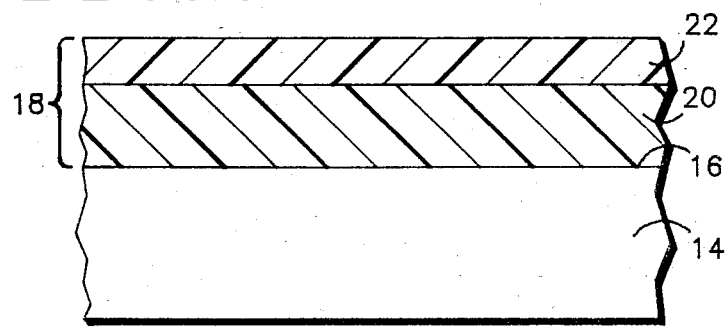
FIG. 2 illustrates, in cross section, a portion of a semiconductor device in accordance with one embodiment of the invention.

In accordance with the invention, multiple layer antireflection coatings are achieved by selectively implanting hydrogen into a dielectric layer to controllably modify the index of refraction of portions of the dielectric layer. A structure formed in accordance with the invention is illustrated in FIG. 2. For purposes of illustration only, the invention will be described in terms of forming an antireflection coating on a silicon substrate. The invention is not limited, of course, to application to silicon substrates.

The structure of FIG. 2 includes a silicon substrate 14 having a surface 16. A layer of dielectric material 18 is formed overlying surface 16. The dielectric material can be, for example, silicon nitride, titanium dioxide, tantalum pentoxide, silicon monoxide, or the like. Preferably for a silicon substrate, the dielectric material is silicon nitride formed by low pressure chemical vapor deposition. Low pressure chemical vapor deposited silicon nitride provides an optically uniform and dense film having an index of refraction of about 2.0. The exact index of refraction depends upon the conditions of deposition and the stoichiometry of the film. Varying the proportions of silicon and nitrogen contained in the film, for example, will slightly change the index of refraction. Dielectric material 18 can have a thickness of, for example, about 85 nanometers, but the exact thickness chosen for the layer is dependent upon the wave length of the light to be incident upon the surface. The top surface of the dielectric material 18 is then implanted with hydrogen to form a hydrogen implanted layer 22 having a thickness less than the total thickness of layer 18. An implant at an energy of 1.0 Kv and a dose of $2 \times 10^{16}$ cm$^{-2}$ forms a layer 22 having a thickness of about 15 nanometers and an index of refraction of about 1.7. The layer 22 having an index of refraction of 1.7 thus overlies the remaining portion of layer 18, here designated as 20, which has the original index refraction of 2.0 and has a thickness of about 70 nanometers.

The two layers in tandem, layer 22 and layer 20, act as an integral, double layer antireflection coating designed to provide less reflection over the usable solar spectrum than does an optimized single layer coating. The formation of the double layer coating, in accordance with the invention, can be performed either after the device fabrication is otherwise complete, or it can be performed at any intermediate step in the process sequence.

Although the device illustrated in FIG. 2 has only a double layer antireflection coating, the process in accordance with the invention can be extended to the formation of a larger number of layers if a multiple layer antireflection coating is needed for the device being constructed. More than two layers can be provided by additional implants, for example, into the layer 22. The use of multiple layers will require an analysis of the optimum thickness and index of refraction for each of the layers to suit the particular spectrum being addressed. Further, hydrogen implants into the dielectric layer can be adjusted in energy and dose to provide a continuous or semicontinuous change in index of refraction. The index of refraction can thus be graded from a value characteristic of the as-deposited film to some lower value at the dielectric surface. This is accomplished by providing a hydrogen implant with a concentration gradient varying with depth into the dielectric material with the concentration being greatest at the surface and decreasing with depth. Selection of the optimum values of thickness and index of refraction can be accomplished in accordance with calculations using standard optics formulae. The index of refraction and the thickness of the individual layers can be adjusted by adjusting the dose and energy of the hydrogen implant. The index of refraction is decreased with increasing hydrogen ion doses, but the exact relationship between index and dose is a function of other conditions such as stoichiometry of the film, temperature of deposition, density of the film (which, in turn, is a function of deposition temperature), and the like. For a given set of deposition conditions, therefore, the relationship between hydrogen implant dose and index of refraction must be independently determined.

Figure 3:
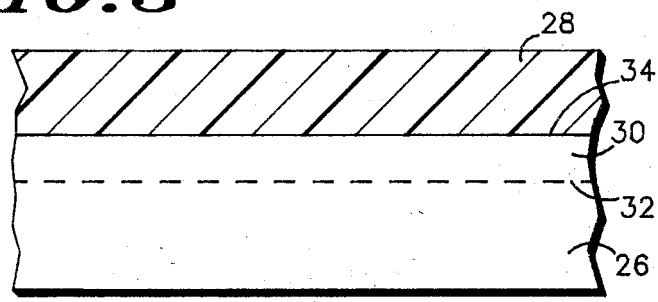
FIG. 3 illustrates, in cross section, a portion of a semiconductor device in accordance with a further embodiment of the invention.

FIG. 3 illustrates a further structure processed in accordance with a further embodiment of the invention. A substrate 26 such as a semiconductor substrate of indium phosphide or silicon has an index of refraction which is much higher than most dielectric materials. The high index of refraction makes it difficult to optimally match the substrate with an antireflection coating 28. In accordance with the invention, the index of refraction of a surface layer of substrate 26 is reduced by implanting that surface layer with hydrogen ions. A surface region 30 surrounded by the dash line 32 is implanted with hydrogen ions to reduce the index of refraction of the surface region to a value below that of the remainder of substrate 26. In a preferred embodiment, an antireflection layer 28 is formed overlying surface 34 of substrate 26. Antireflection layer 28 can be a single layer antireflection coating, or, in a preferred embodiment, is a multiple layer antireflection coating formed in accordance with the invention. In the preferred embodiment, therefore, the antireflection coating 28 is formed as described above.

The process for forming a multiple layer antireflection coating in accordance with the invention is particularly applicable to the fabrication of semiconductor devices, and especially photovoltaic cells. In this application, the substrate is generally silicon and the incident spectrum of interest is the solar spectrum. The following non-limiting examples are illustrative of preferred embodiments and help to further explain the invention.

EXAMPLE I

Silicon solar cells are fabricated in single crystal, P type silicon rectangular wafers having a size of about 2.5 cm. by about 5 cm. A shallow PN junction was formed in the rectangular wafer by a shallow phosphorous diffusion. Aluminum was then evaporated and alloyed on the back surface of the wafer. An antireflection coating of silicon nitride was deposited on the wafers by a low pressure chemical vapor deposition process. The silicon nitride was deposited from the reaction of dichlorosilane and ammonia at a pressure of about 300 millitorr and a temperature of about 800° C. The refractive index of the silicon nitride layer was measured to be about 2.0. The silicon nitride was removed from the back surface of the wafer and a finger-like pattern was etched through the silicon nitride on the front surface of the wafer. Through the pattern in the silicon nitride a first layer of nickel was plated and then sintered. This was followed by sequentially plated layers of copper and nickel. The solar cells were exposed to the solar spectrum and the conversion efficiency was measured to be 13.3%, the open circuit voltage was measured to be 0.610 volts, and the short circuit current was measured to be 30.98 mA/cm$^2$. The antireflection coating covering the solar cells was then implanted with hydrogen at 1 keV to a dose of about $2\times10^{16}$ cm$^{-2}$ in accordance with the invention. The solar cells were again exposed to the full solar spectrum and the efficiency was measured to be 14.0%, the open circuit voltage was measured to be 0.619 volts, and the short circuit current was measured to be 32.20 mA/cm$^2$. The increase of about 4% in the short circuit current is in agreement with the increase expected from the improved optical coupling to the solar spectrum which ranges effectively from about 0.4 μm to about 1.1 μm. The improved optical coupling results from the use of a double layer antireflection coating in contrast to the original single layer antireflection coating. The spectral response measurements indicated that the increase in response to the blue light portion of the spectrum was greater than the increase for the red light portion of the spectrum in accordance with the theoretical performance expected for this optical layer combination.

EXAMPLE II

Crystalline silicon was measured using ellipsometry (6328 Angstrom) to have optical constants of n=3.841 for the real part of the index of refraction and $$k=\alpha\lambda/4\pi=-0.108$$

for the imaginary part. Here $\alpha$ is the absorption coefficient and $\lambda$ is the wavelength. After hydrogen implantation for one minute at 1 keV at an estimated beam current of 220 μA/cm$^2$ the values changed to n=3.364 and k=−0.796. The decrease in the value of n results in a reduction in reflection while the decrease in the value (increase in the absolute value) of k results in increased absorption. Similar results were achieved with other semiconductor material such as indium phosphide.

Thus it is apparent that there has been provided, in accordance with the invention, a process for fabricating an improved antireflection coating that fully meets the objects and advantages set forth above. While the invention has been described and illustrated with respect to specific embodiments, it is not intended that the invention be limited to those illustrative embodiments. Those skilled in the art will recognize, after consideration of the foregoing description, that many variations and modifications are possible without departing from the scope of the invention. For example, the invention has been illustrated with reference to use in conjunction with semiconductor substrates. It is also apparent that the invention can be applied to other optical systems in which the substrate is not a semiconductor material. For example, the process can be applied to forming antireflective coatings on optical lenses and the like. Further, in some instances, and especially with semiconductor materials, it may be preferable to form a first layer of material on the substrate before depositing or otherwise forming a layer of dielectric material. This interfacial layer may be necessary, especially when forming nitride layers on a silicon substrate, to avoid or reduce the formation of undesirable surface states at the nitride-silicon interface.

Accordingly, it is intended to include within the invention all such variations and modifications as fall within the appended claims.

I claim:

1. A process for providing an improved antireflection coating on a substrate which comprises the steps of: forming a layer of dielectric material overlying said substrate, said layer having a first thickness and a first index of refraction; implanting hydrogen into a surface region of said layer to form a sub layer having a thickness less than said first thickness and an index of refraction less than said first index of refraction.

2. The process of claim 1 wherein said steps of implanting hydrogen into a surface region comprises adjusting the energy and dose of implant to form a sub layer in which the hydrogen concentration varies with depth in said dielectric material, said concentration being greatest at the surface and decreasing with depth into said dielectric material.

3. A process for reducing the reflection of a semiconductor substrate which comprises the steps of: providing a semiconductor substrate having a surface; implanting hydrogen into said surface to form a surface region having a reduced index of refraction; and forming an antireflection layer overlying said surface.

4. The process of claim 3 wherein said antireflection layer comprises silicon nitride.

5. The process of claim 4 further comprising the step of implanting a surface layer of said silicon nitride to reduce the index of refraction of said surface layer.

6. The process of claim 3 wherein said antireflection layer comprises silicon monoxide.

7. A process for fabricating a semiconductor device comprising the steps of: providing a semiconductor substrate having a region of first conductivity type and a region of second conductivity type; forming a layer of silicon nitride overlying said substrate, said layer having a first thickness and a first index of refraction; implanting hydrogen into said layer to a depth less than said first thickness to form a surface region of second thickness less than said first thickness and having a second index of refraction less than said first index of refraction.

8. The process of claim 7 wherein said step of implanting hydrogen comprises adjusting the energy and dose of implant to form a region in which the hydrogen concentration varies with depth in said silicon nitride, said concentration being greatest at the surface and decreasing with depth into said silicon nitride.

9. A process for fabricating an improved antireflection coating on a substrate which comprises the steps of: providing a substrate; forming a layer of dielectric material having a first thickness and a first index of refraction overlying said substrate; implanting hydrogen into said layer to form a first hydrogen implanted region extending from the surface of said layer to a second thickness less than said first thickness to reduce the index of refraction of said region to a value less than said first index of refraction; and implanting hydrogen into said first region to form a second hydrogen implanted region of third thickness less than said second thickness to further reduce the index of refraction of said third region.

10. The process of claim 9 wherein said dielectric material is selected from the group consisting of silicon nitride, silicon oxide, titanium dioxide and tantalum pentoxide.

* * * * *